United States Patent
Sato et al.

(10) Patent No.: US 7,372,086 B2
(45) Date of Patent: May 13, 2008

(54) SEMICONDUCTOR DEVICE INCLUDING MOSFET AND ISOLATION REGION FOR ISOLATING THE MOSFET

(75) Inventors: Tsutomu Sato, Yokohama (JP); Ichiro Mizushima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 252 days.

(21) Appl. No.: 10/820,182

(22) Filed: Apr. 8, 2004

(65) Prior Publication Data

US 2004/0256693 A1    Dec. 23, 2004

(30) Foreign Application Priority Data

May 7, 2003    (JP)    ............... 2003-129177

(51) Int. Cl.
*H01L 29/78*    (2006.01)

(52) U.S. Cl. ............... 257/250; 257/401; 257/E29.264; 438/283

(58) Field of Classification Search ............... 257/239, 257/314–323, E21.546, E21.549, E29.3–E29.308, 257/510, 513, 250, 270, 365, 366, 401, E21.178, 257/E21.179, E21.621, E21.455, E27.192, 257/E29.264, E29.275, E29.319; 438/279, 438/283, 157
See application file for complete search history.

(56) References Cited

U.S. PATENT DOCUMENTS

| | | | | |
|---|---|---|---|---|
| 5,348,899 A | * | 9/1994 | Dennison et al. ............ | 438/157 |
| 5,482,877 A | * | 1/1996 | Rhee ............... | 438/157 |
| 5,498,891 A | * | 3/1996 | Sato ............... | 257/316 |
| 5,583,362 A | * | 12/1996 | Maegawa ............ | 257/347 |
| 5,658,806 A | * | 8/1997 | Lin et al. ............ | 438/157 |
| 5,773,331 A | * | 6/1998 | Solomon et al. ........... | 438/164 |
| 5,844,270 A | * | 12/1998 | Kim et al. ............... | 257/315 |
| 5,965,914 A | * | 10/1999 | Miyamoto ............ | 257/331 |
| 6,001,705 A | * | 12/1999 | Zombrano ............ | 438/421 |
| 6,100,132 A | | 8/2000 | Sato et al. | |
| 6,159,807 A | * | 12/2000 | Bryant et al. ............. | 438/289 |
| 6,239,465 B1 | * | 5/2001 | Nakagawa ............. | 257/331 |

(Continued)

FOREIGN PATENT DOCUMENTS

JP    60-150644    8/1985

(Continued)

OTHER PUBLICATIONS

T. Sato et al., "A New Substrate Engineering for the Formation of Empty Space in Silicon (ESS) induced by Silicon Surface Migration", IEDM Technical Digest, pp. 517-520, (1999).

(Continued)

*Primary Examiner*—Eugene Lee
*Assistant Examiner*—William Kraig
(74) *Attorney, Agent, or Firm*—Finnegan, Henderson, Farabow, Garrett & Dunner, L.L.P.

(57) ABSTRACT

A semiconductor device comprises a semiconductor substrate, a MOSFET including a double gate structure provided on the semiconductor substrate, and an isolation region for isolating the MOSFET from other elements comprising a trench provided on the surface of the semiconductor substrate and an insulator provided in the trench, a part of the isolation region in the trench around the MOSFET having a bottom deeper than other part of the isolation region.

14 Claims, 10 Drawing Sheets

U.S. PATENT DOCUMENTS

| | | | | |
|---|---|---|---|---|
| 6,365,465 | B1* | 4/2002 | Chan et al. | 438/283 |
| 6,433,609 | B1* | 8/2002 | Voldman | 327/313 |
| 6,552,380 | B1 | 4/2003 | Sato et al. | |
| 6,570,217 | B1 | 5/2003 | Sato et al. | |
| 6,580,132 | B1* | 6/2003 | Chan et al. | 257/365 |
| 6,649,979 | B2* | 11/2003 | Jang | 257/347 |
| 6,661,044 | B2* | 12/2003 | Jang | 257/288 |
| 6,762,101 | B2* | 7/2004 | Chan et al. | 438/283 |
| 6,844,588 | B2* | 1/2005 | Cavins et al. | 257/324 |
| 7,015,547 | B2* | 3/2006 | Hackler et al. | 257/347 |
| 2002/0076865 | A1* | 6/2002 | Dennison et al. | 438/157 |
| 2002/0093053 | A1* | 7/2002 | Chan et al. | 257/347 |
| 2002/0105039 | A1* | 8/2002 | Hanafi et al. | 257/401 |
| 2002/0192911 | A1* | 12/2002 | Parke | 438/270 |
| 2003/0146488 | A1* | 8/2003 | Nagano et al. | 257/506 |
| 2006/0134868 | A1* | 6/2006 | Yoon et al. | 438/283 |
| 2007/0048938 | A1* | 3/2007 | Yun et al. | 438/257 |

FOREIGN PATENT DOCUMENTS

| | | |
|---|---|---|
| JP | 63-278375 | 11/1988 |
| JP | 2-280381 | 11/1990 |
| JP | 05-235337 | 9/1993 |
| JP | 10-256362 | 9/1998 |
| JP | 2000-12858 | 1/2000 |
| JP | 2000-58780 | 2/2000 |
| JP | 2001-144276 | 5/2001 |
| JP | 2001-257358 | 9/2001 |
| JP | 2002-237575 | 8/2002 |
| JP | 2002-324836 | 11/2002 |
| JP | 2003-008008 | 1/2003 |
| JP | 2003-31799 | 1/2003 |

OTHER PUBLICATIONS

T. Sato et al., "SON(Silicon on Nothing) MOSFET using ESS(Empty Space in Silicon) Technique for SoC Applications", IEDM Technical Digest, pp. 809-812, (2001).

T. Sato et al., "ESS(Empty Space in Silicon) SON(Silicon on Nothing). A New Substrate Engineering for the Formation of Empty Space in Silicon (ESS) induced by Silicon Surface Migration", Japan Society of Applied Physics, Silicon Technology, No. 14, pp. 61-65, Jan. 2000.

T. Sato et al., "Trench Transformation Technology using Hydrogen Annealing for Realizing Highly Reliable Device Structure with Thin Dielectric Films", 1998 Symposium on VLSI Technology, Digest of Technical Papers, pp. 206-207, (1988).

S. Matsuda et al., "Novel Corner Rounding Process for Shallow Trench Isolation utilizing MSTS (Micro-Structure Transformation of Silicon)", IEDM Technical Digest, pp. 137-140, (1998).

T. Sato et al., "Discussion about dissolution of COP Defects by Direct Observation of Intentionally Grown Large Vacancy", Japan Society of Applied Physics, Extended Abstracts (The 60$^{th}$ Autumn Meeting, 1999), 2p-S-17, p. 355, (1999).

T. Sato et al., "ESS(Empty Space in Silicon) SON(Silicon on Nothing). A New Substrate Engineering using Silicon Surface Migration(1) SON Structure realized by ESS", Japan Society of Applied Physics, Extended Abstracts (The 47$^{th}$ Spring Meeting, 2000), 31a-YK-6, p. 888, (2000).

T. Sato et al., "ESS(Empty Space in Silicon). A New Substrate Engineering using Silicon Surface Migration(2) Design Guide for ESS Fabrication", Japan Society of Applied Physics, Extended Abstracts (The 47$^{th}$ Spring Meeting, 2000), 31a-YK-7, p. 889, (2000).

T. Sato et al., "Theoretical Study on the Formation Process of Empty Space in Silicon", Japan Society of Applied Physics, Extended Abstracts (The 47$^{th}$ Spring Meeting, 2000), 31-a-YK-8, p. 889, (2000).

I. Mizushima et al., The Surface Science Society of Japan, 19$^{th}$, p. 14, (1999).

M. Kito et al., "Semiconductor Device and Manufacturing Method Thereof", U.S. Appl. No. 09/549,513, filed Apr. 14, 2000.

T. Sato et al., "Semiconductor Substrate and its Fabrication Method", U.S. Appl. No. 09/650,748, filed Aug. 30, 2000.

A. Yagishita, "Semiconductor Device and Manufacturing Method Thereof", U.S. Appl. No. 10/436,181, filed May 13, 2003.

K. Inoh, "Semiconductor Device with a Cavity therein and a Method of Manufacturing the same", U.S. Appl. No. 10/665,614, filed Sep. 19, 2003.

Monfray et al., "50nm—Gate All Around (GAA)—Silicon On Nothing (SON)—Devices: A Simple Way to Co-integration of GAA Transistors within bulk MOSFET process," Symposium on VLSI Technology Digest of Technical Papers (2002), pp. 108-109, no month cited.

Sato et al., "A New Substrate Engineering for the Formation of Empty Space in Silicon (ESS) Induced by Silicon Surface Migration", International Electron Device Meeting, pp. 20.6.1-20.6.4, Dec. 1999.

Sato et al., "Fabrication of Silicon-on-Nothing Structure by Substrate Engineering Using the Empty-Space-in-Silicon Formation Technique", Japanese Journal of Applied Physics, vol. 43, pp. 12-18, Jan. 2004.

Notification of Reasons for Rejection issued in Japanese Patent Application 2003-129177 by the Japanese Patent Office and English translation thereof.

* cited by examiner

SEMICONDUCTOR DEVICE INCLUDING MOSFET AND ISOLATION REGION FOR ISOLATING THE MOSFET

CROSS-REFERENCE TO RELATED APPLICATIONS

This application is based upon and claims the benefit of priority from prior Japanese Patent Application No. 2003-129177, filed May 7, 2003, the entire contents of which are incorporated herein by reference.

BACKGROUND OF THE INVENTION

1. Field of the Invention

The present invention relates to a semiconductor device including double gate structure and a method of manufacturing the same.

2. Description of the Related Art

Current drive capability is given as one of MOSFET operation characteristic indexes. The enhancement of the current drive capability is conventionally achieved by micro-fabrication of elements. The gate length of the MOSFET is already micro-fabricated less than 0.1 μm scale. Currently, there has been made researches and developments of semiconductor process to realize further micro-fabrication. However, it is technically difficult to realize this kind of semiconductor process, and in addition, it is difficult to realize it in view of the development cost.

According to methods other than micro-fabrication, it is required to improve operation characteristics such as high drive current. The following proposal is made as one of the methods. The proposal is to employ a so-called double gate structure or gate all around structure. According to the double gate structure, both front side and backside surface of the semiconductor active layer are formed with a channel. The double gate structure is employed, and thereby, drain current increases generally twice as much, so that the current drive capability can be greatly improved.

In order to realize a MOSFET including the double gate structure, the backside (back gate side) need to be formed with a gate structure (gate electrode/gate insulator/semiconductor layer).

However, it is technically difficult to form the gate structure onto the backside surface. In addition, according to the conventional technique, it is possible to realize the double gate structure only by the method of carrying out complicate processes (e.g., JPN. PAT. APPLN. KOKAI Publication No. 2000-12858). As a result, the MOSFET including the double gate structure has not been practically utilized.

On the other hand, the following report relating to the MOSFET including the gate all around structure has been made (S. Monfey et al., 2002 Symposium on VLSI Technology, 11.4, digest of Technical Papers p. 108). According to the report, the MOSFET includes the structure in which the periphery of a channel region is surrounded with a gate electrode. The MOSFET process includes the following processes of depositing SiGe, etching it, and the like; as a result, the process becomes complicated. In addition, there is a problem that it is difficult to control the width of the gate electrode on the backside of the MOSFET.

Incidentally, there has been known a MOS transistor including the structure similar to the double gate structure (JPN. PAT. APPLN. KOKAI Publications No. 2003-31799 and 2000-12858).

In FIG. 11 of JPN. PAT. APPLN. KOKAI Publication No. 2003-31799, there has been disclosed a device seen as if it is a MOS transistor including a double gate structure. However, the backside polysilicon 110 is not electrically connected with any components. According to the description of the paragraph 0037, it can be seen that thermal conductivity is simply improved, and thereby, the polysilicon 101 is merely used to prevent self-heating.

In FIG. 8C of JPN. PAT. APPLN. KOKAI Publication No. 2000-12858, there has been disclosed a structure close to the double gate structure. However, according to the structure, the component buried in a substrate is an insulating film, as seen from FIG. 8C. Therefore, the foregoing structure differs from the double gate structure.

BRIEF SUMMARY OF THE INVENTION

According to an aspect of the present invention, there is provided a semiconductor device comprising: a semiconductor substrate; a MOSFET including a double gate structure provided on the semiconductor substrate; and an isolation region for isolating the MOSFET from other elements comprising a trench provided on the surface of the semiconductor substrate and an insulator provided in the trench, the isolation region having a region in the trench around the MOSFET, the region having a deeper bottom than other regions in the trench.

According to an aspect of the present invention, there is provided a method of manufacturing a semiconductor device, comprising: forming an empty space in a semiconductor substrate; forming an isolation region on a surface of the semiconductor substrate comprising forming a trench by etching the surface of the semiconductor substrate so that a part of the empty space is opened, and forming an insulator in the trench without closing the empty space; and forming a MOSFET including a double gate structure isolated from other elements by the isolation region in the semiconductor substrate.

DETAILED DESCRIPTION OF THE INVENTION

Embodiments of the present invention will be described below with reference to the accompanying drawings.

First Embodiment

FIG. 1A, FIG. 1B and FIG. 1C to FIG. 8A, FIG. 8B and FIG. 8C are views showing the process of manufacturing a MOSFET including double gate structure according to a first embodiment of the present invention. FIG. 1B and 1C to FIG. 8B and FIG. 8C are cross-sectional views taken along a line A-A' of FIG. 1A to FIG. 8A and taken along a line B-B' of the same.

Figure 1A:
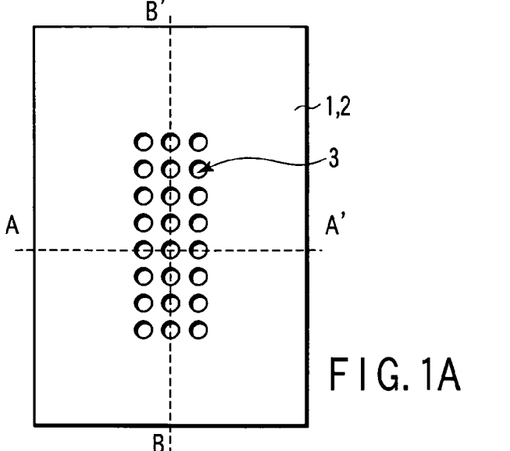
FIG. 1A is a plane view showing the process of manufacturing a MOSFET including double gate structure according to a first embodiment of the present invention.
Figure 1B:
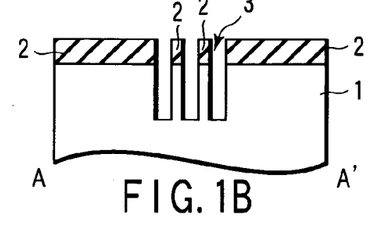
FIG. 1B and FIG. 1C are cross-sectional views showing the same.
Figure 1C:
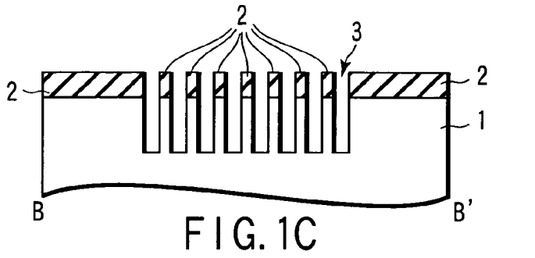

As shown in FIG. 1A to FIG. 1C, a silicon oxide film mask pattern 2 for forming trenches is formed on a silicon substrate 1. The silicon substrate 1 is etched by RIE (reactive ion etching) process using the mask pattern as the mask, and thus, several trenches 3 are formed.

The mask pattern 2 is formed according to the public-known process including the following processes. One is a process of forming a silicon oxide film on the surface of the silicon substrate 1 by thermal oxidation. Another is a process of depositing a silicon oxide film on the surface of the silicon substrate 1 by CVD process. Another is a process of patterning these silicon oxide films (i.e., thermal oxide film, CVD oxide film).

In place of the silicon oxide film mask pattern 2, the following mask pattern may be used. The mask pattern consists of other insulating films such as silicon nitride film or multi-layered insulating film of silicon oxide film/silicon nitride film.

Figure 2A:
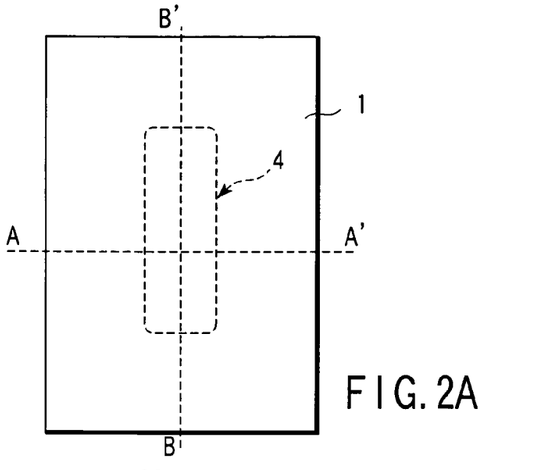
FIG. 2A is a plane view showing the process of manufacturing the MOSFET including double gate structure of the first embodiment.
Figure 2B:
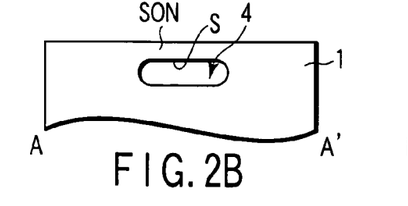
FIG. 2B and FIG. 2C are cross-sectional views showing the same, following FIG. 1A, FIG. 1B and FIG. 1C.
Figure 2C:
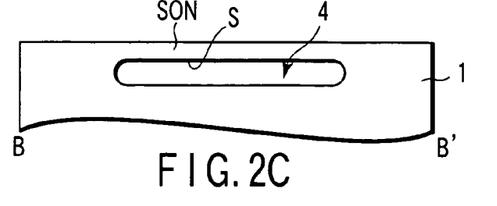

As illustrated in FIG. 2A to FIG. 2C, the mask pattern 2 is removed by wet etching. Thereafter, the silicon substrate 1 is heated by a heat treatment under low pressure in a reducing atmosphere such as hydrogen, and an empty space (empty space in silicon: ESS) 4 is formed in the silicon substrate 1.

The front surface (upper surface) and backside (lower surface) of the silicon substrate 1 (silicon on nothing: SON) on the ESS 4 are regions where the channel of MOSFET is formed. In the embodiment, part of the side surface of the SON is also a region where the channel is formed.

The plane pattern of the ESS 4 is a longitudinally elongated rectangle (longer side direction is channel width direction, shorter side direction is channel length direction), as seen from FIG. 2A. In this case, other pattern may be used.

The upper surface (top wall) S of the ESS 4 is curved at the corner, as seen from FIG. 2B and FIG. 2C, and other portions thereof are flat. The upper surface S of the ESS 4 is a silicon region formed with the channel; therefore, it is preferable that the upper surface is flat as much as possible.

The details of the heat treatment for forming the ESS 4 are disclosed in JPN. PAT. APPLN. KOKAI Publication No. 2000-12858. The explanation will be briefly made below. The heat treatment for forming the ESS 4 is carried out in hydrogen atmosphere under conditions of 300 Torr, 1100° C. and for a minute.

If the surface height of the silicon substrate 1 on the ESS 4 reduces due to the heat treatment, treatment for smoothing the surface of the silicon substrate 1 may be carried out. The smoothing treatment (planarizing) is detailedly disclosed in JPN. PAT. APPLN. KOKAI Publication No. 2001-144276. The explanation will be briefly made below. The treatment for smoothing the surface of the silicon substrate 1 includes the following processes. One is a process of planarizing the surface of the silicon substrate 1 by chemical mechanical polishing (CPM). Another is a process of oxidizing the planarized the surface of the silicon substrate 1.

Figure 3A:
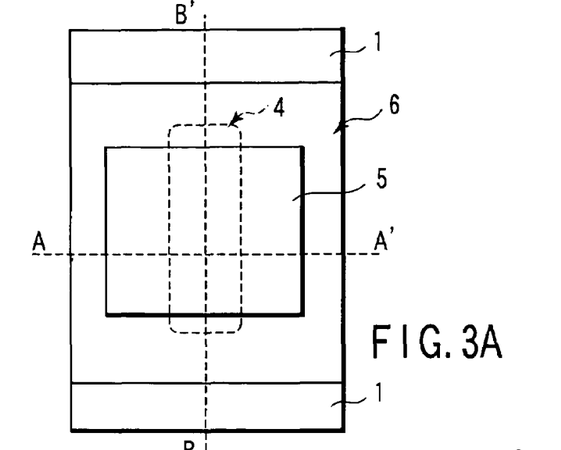
FIG. 3A is a plane view showing the process of manufacturing the MOSFET including double gate structure of the first embodiment.
Figure 3B:
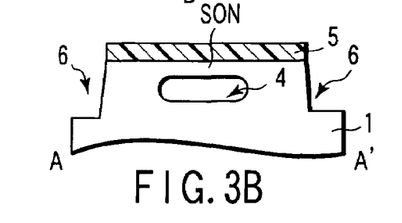
FIG. 3B and FIG. 3C are cross-sectional views showing the same, following FIG. 2A, FIG. 2B and FIG. 2C.
Figure 3C:
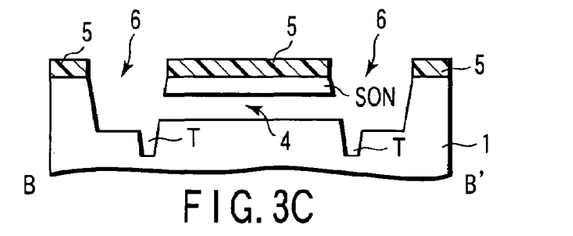

As depicted in FIG. 3A to FIG. 3C, a silicon nitride film mask pattern 5 for forming isolation trench is formed on the silicon substrate 1. The mask pattern 5 is formed so that the entire surface of the silicon substrate 1 on the ESS 4 is not covered, but so that part thereof is exposed. Here, as seen from the plane view of FIG. 3A, the mask pattern 5 is formed so that part of the ESS 4 (both ends in channel width direction) is not covered.

Thereafter, the silicon substrate 1 is etched by RIE process using the mask pattern 5 as the mask so that isolation trench (shallow trench isolation: STI) 6 can be formed. After the isolation trench 6 is formed, the ESS 4 is formed into not a closed empty space (cavity), but an opened empty space (cavity). The upper walls on ends of the ESS 4 in the channel width direction are opened due to the isolation trench 6.

In this case, the isolation trench 6 of the embodiment differs from the conventional case in the depth of the bottom partially. More specifically, a region T under the ESS 4, which is not covered with the mask pattern 5, has deeper bottom than other regions. This results from the following reason. In etching, the portion under the ESS 4, which is not covered with the mask pattern 5, is the same as a state of being previously etched by the depth of the ESS 4.

In this stage, since the MOSFET is not still completed, the isolation trench 6 (isolation region) of the embodiment is explained in view of the relationship with the ESS 4. However, after the MOSFET is completed, the isolation region of the embodiment has the structure in which the partial region has the bottom deeper than other regions in the isolation trench 6 around the MOSFET.

Figure 4A:
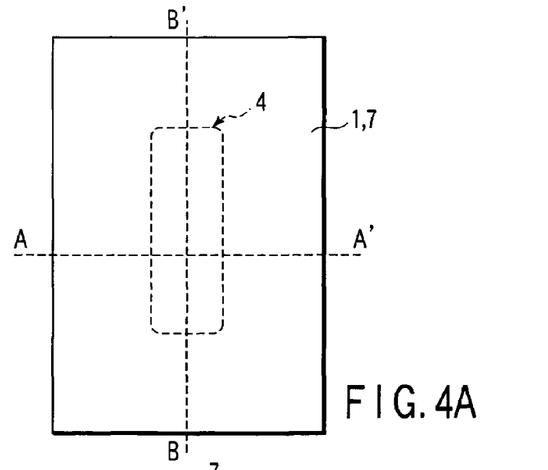
FIG. 4A is a plane view showing the process of manufacturing the MOSFET including double gate structure of the first embodiment.
Figure 4B:
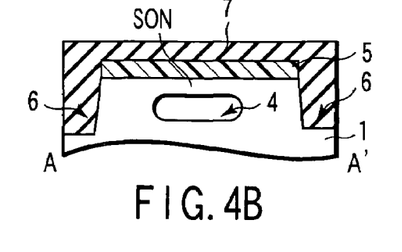
FIG. 4B and FIG. 4C are cross-sectional views showing the same, following FIG. 3A, FIG. 3B and FIG. 3C.
Figure 4C:
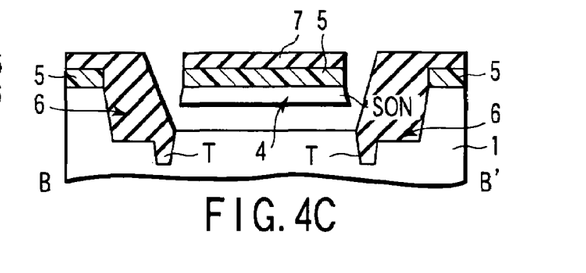

As seen from FIG. 4A to FIG. 4C, a silicon oxide film 7 (insulator) is deposited on the entire surface as the buried member of the isolation trench 6 by anisotropic deposition process such as high density plasma (HDP)-CVD process.

Here, anisotropic deposition process such as HDP is employed; for this reason, no silicon oxide film is deposited on the region having a steep slope. As a result, no silicon oxide film is deposited on the inner wall in the deep region of the isolation trench 6. Therefore, it is possible to deposit the silicon oxide film 7 having a desired shape, which is necessary for isolation and does not close the opening of the SON, as shown in FIG. 4A to FIG. 4C.

Figure 5A:
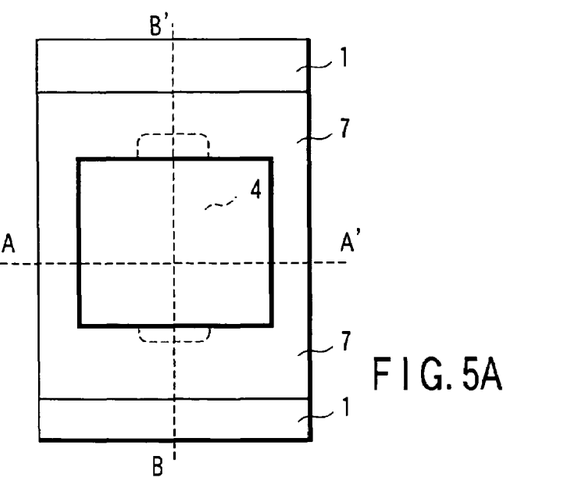
FIG. 5A is a plane view showing the process of manufacturing the MOSFET including double gate structure of the first embodiment.
Figure 5B:
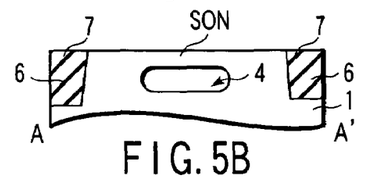
FIG. 5B and FIG. 5C are cross-sectional views showing the same, following FIG. 4A, FIG. 4B and FIG. 4C.
Figure 5C:
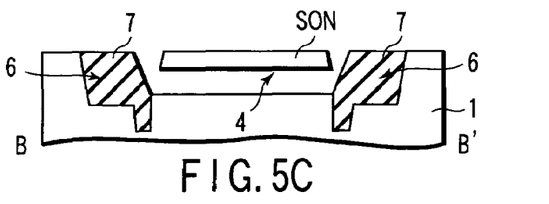

As illustrated in FIG. 5A to FIG. 5C, the silicon oxide film 7 other than the isolation trench 6 is removed by CMP process. Then, the mask pattern 5 is removed while the surface of the silicon substrate 1 is planarized. In this case, the mask pattern 5 may be removed by etching.

In this manner, the isolation region for isolating the MOSFET formed in the next process from other elements (e.g., other MOSFET including double gate structure) is completed.

In this case, as seen from FIG. 5A to FIG. 5C, the region in which the silicon oxide film 7 is not buried remains at both sides of the ESS 4. This is because the silicon oxide film 7 is deposited by anisotropic deposition process. If the region (gap) in which the silicon oxide film 7 is not buried remains at both sides of the ESS 4, the silicon oxide film 7 may be formed by isotropic deposition process.

Figure 6A:
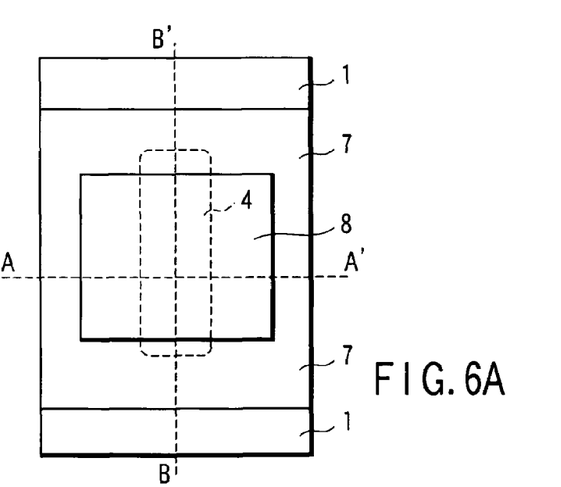
FIG. 6A is a plane view showing the process of manufacturing the MOSFET including double gate structure of the first embodiment.
Figure 6B:
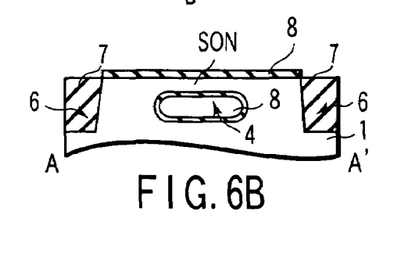
FIG. 6B and FIG. 6C are cross-sectional views showing the same, following FIG. 5A, FIG. 5B and FIG. 5C.
Figure 6C:
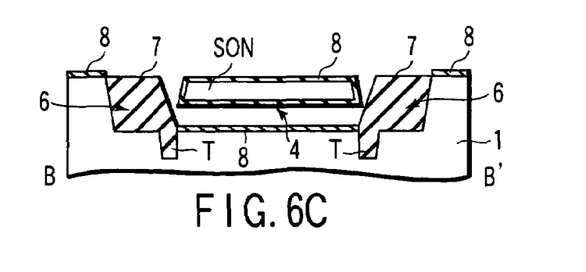

As depicted in FIG. 6A to FIG. 6C, a gate insulating film (thermal oxide film) 8 is formed on the surface of the silicon substrate 1 by public-known thermal oxidation.

The gate insulating film 8 is formed on the entire surface of exposed silicon shown in FIG. 6A to FIG. 6C. Thus, the gate insulating film 8 is formed on any of the upper, side and lower surfaces of the SON and the lower surface (bottom) of the ESS 4. In other words, the lower surface of the SON is the upper surface (top wall) of the ESS 4.

According to the embodiment, the gate insulating films, that is, top and bottom gate insulating films on the silicon substrate 1 and therein are simultaneously formed by the identical process. Therefore, the process is simplified.

In the embodiment, the thermal oxide film is used as the gate insulating film 8. In this case, a silicon oxide film formed by the method using radical or a silicon oxinitride film (SiON film) containing nitrogen may be used. In addition, the following process may be employed. According to the process, the thermal oxide film is simultaneously formed on the upper and lower surfaces of the MOSFET active region (SON), thereafter, nitriding is carried out with respect to only upper surface. Namely, the thermal oxide film is formed on the lower surface while the SiON film is formed on the upper surface.

Incidentally, it is important to form the bottom gate insulating film in view of the following matter. The bottom gate insulating film is formed between the silicon substrate under the gate electrode (top gate electrode) on the silicon substrate 1 and the gate electrode (bottom gate electrode) therein. In addition, the bottom gate insulating film has no need to entirely close the inner wall of the ESS 4.

Figures 7A, 7B, 7C:
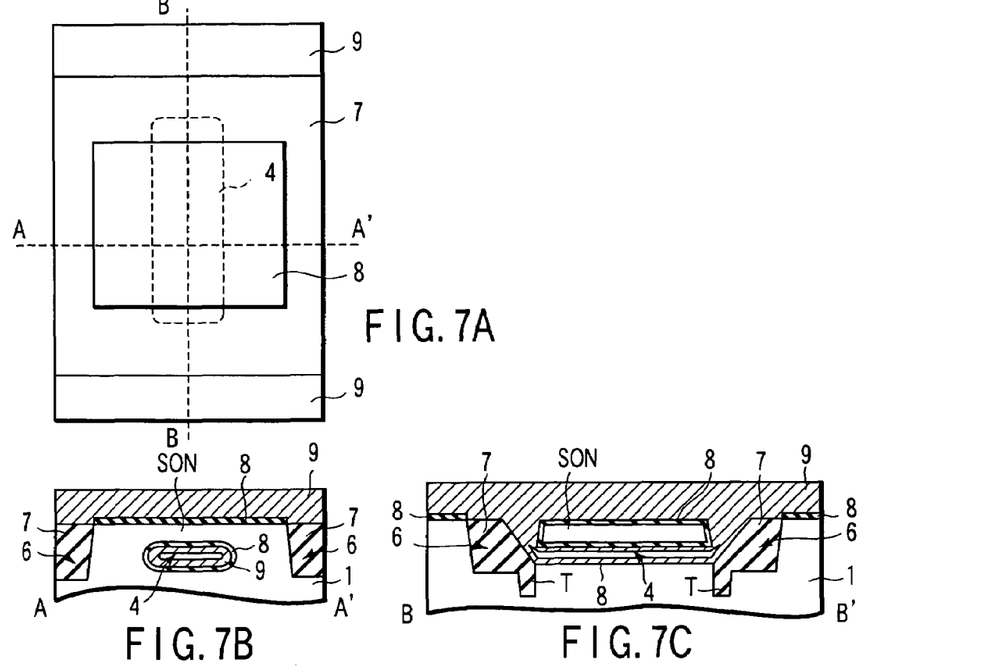
FIG. 7A is a plane view showing the process of manufacturing the MOSFET including double gate structure of the first embodiment.
FIG. 7B and FIG. 7C are cross-sectional views showing the same, following FIG. 6A, FIG. 6B and FIG. 6C.

As shown in FIG. 7A to FIG. 7C, a polysilicon film 9 functioning as the gate electrode is deposited on the gate insulating film 8 by CVD process. The polysilicon film 9 includes impurity used as dopant.

In the deposition of the polysilicon film 9, silicon source gas is introduced into the ESS 4 from both sides of the ESS 4, that is, the region (gap) in which the silicon oxide film 7 is not buried. In this way, the polysilicon film 9 is deposited on the inner wall (gate insulating film 8) of the ESS 4. The deposition of the polysilicon film 9 in the inner wall of the ESS 4 is carried out until the gap is filled with the polysilicon film 9.

According to the embodiment, the polysilicon film 9 functioning as top and bottom gate electrodes is simultaneously formed by the identical process. Therefore, the process is simplified.

The ESS 4 is not entirely filled with the polysilicon film 9 on normal polysilicon CVD process condition. Therefore, part of the ESS 4 finally remains without being filled with the polysilicon film. For example, non-filled portions of the ESS 4 (i.e., space, which is not filled with bottom gate electrode and insulating film) contribute to reduction of leakage current. The ESS 4 can be entirely buried depending upon the process condition of the polysilicon film 9 deposition.

Figure 8A:
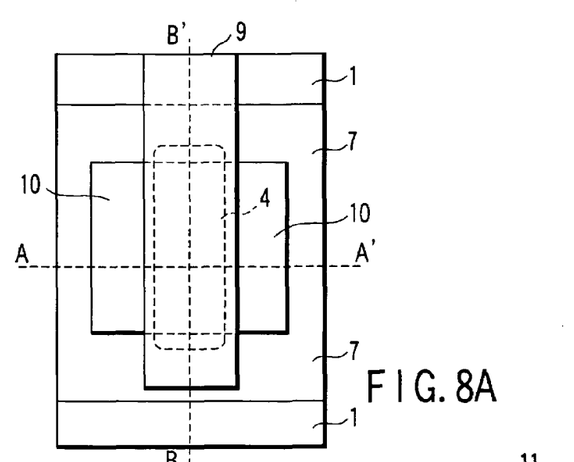
FIG. 8A is a plane view showing the process of manufacturing the MOSFET including double gate structure of the first embodiment.
Figure 8B:
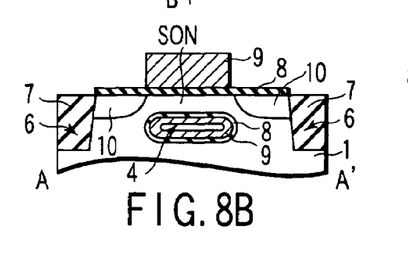
FIG. 8B and FIG. 8C are cross-sectional views showing the same, following FIG. 7A, FIG. 7B and FIG. 7C.
Figure 8C:
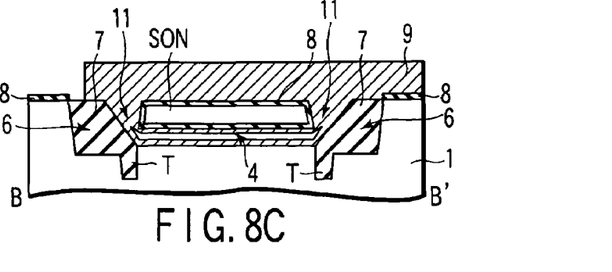

Incidentally, impurity doping into the polysilicon film 9 may be carried out according to normal methods. For example, if ion implantation is employed, ion is not implanted to the back gate side. However, the diffusion coefficient of impurity into the polysilicon film is high, that is, 100 times as much as that of single crystal silicon. Thus, heat treatment is carried out after ion implantation, and thereby, it is possible to form a low-resistance polysilicon film 9 whose back gate side is doped with impurity with high concentration. In addition, the method of doping impurity in deposition of the polysilicon film 9 may be employed As illustrated in FIG. 8A to FIG. 8C, the polysilicon film 9 is etched using resist pattern (not shown) as the mask, and thus, a gate electrode is formed. In this case, etching is carried out so that each polysilicon film 9 on the silicon substrate 1 and in the ESS 4 is not divided.

According to the embodiment, the process of patterning each polysilicon film 9 for forming top and bottom gate electrodes is the same; therefore, the process is simplified.

Thereafter, as seen from FIG. 8A to FIG. 8C, the MOSFET including double gate structure is completed via the following public-known MOSFET process, that is, process of forming a source/drain region 10 by ion implantation and annealing.

According to the embodiment, the following double gate structures is simultaneously formed by common process. That is the gate structure (top gate structure) including gate insulating film and gate electrode on the silicon substrate 1. And is the gate structure (bottom gate structure) including gate insulating film and gate electrode in the silicon substrate 1. Therefore, a MOS transistor including double gate structure can be realized by very simple process as compared with the conventional method of separately forming top and bottom gate structures by individual processes.

In addition, according to the embodiment, the polysilicon film 9 is deposited in the isolation trench 6 around MOSFET, that is, the region having the deeper bottom in deposition of the polysilicon film 9 shown in FIG. 7A to FIG. 7C. Thus, the isolation trench 6 under the polysilicon film 9 is provided with part of the silicon oxide film 7.

As a result, the polysilicon film 9 (side gate electrode) is formed on the gate insulating film 8 on the side surface of the SON. Consequently, the sidewall (side surface) of the SON is formed with a channel.

Therefore, a MOS transistor including the following structure is formed. More specifically, the MOS transistor has the structure in which the silicon region (silicon substrate 1) around the SON is covered with gate insulating film and gate electrode by the process for originally forming double gate structure. Namely, the MOS transistor has gate all around structure (gate structure including double gate structure). This means that the following type of gate all around structure is formed. As is evident from FIG. 8C, that is, the cross-sectional view in the channel width direction, the silicon region (silicon substrate 1) around the SON is covered with gate insulating film and gate electrode.

Incidentally, true double gate structure is obtained by removing the polysilicon film 9 on the sidewall (side surface) of the SON by etching.

According to the embodiment, the side surface of SON is formed with the channel, in addition to upper and lower surfaces of the MOSFET active region (SON); therefore, current drive capability can be improved.

According to the embodiment, gate electrodes 9 (top and bottom gate electrodes) on upper and lower surfaces of the SON are connected via two contact holes 11 on both sides of the MOSFET including double gate structure, as depicted in FIG. 8A, to FIG. 8C. Therefore, gate parasitic resistance can be reduced.

According to the embodiment, the contact hole 11 connecting top and bottom gate electrodes is formed by means of self align. Therefore, it is unnecessary to secure a region for misalignment. In other words, there is no problem of increasing the chip area even if the double gate structure of the embodiment is employed.

The top and bottom gate electrodes may be are formed physically independent of each other although they are integrally formed. In this case, there is a need of forming the structure for simultaneously applying the same voltage to these top and bottom gate electrodes.

Consequently, it is basically preferable that the top and bottom gate electrodes are integrally formed. The integrally formed gate electrode 9 can be readily formed according to the present embodiment, as described above.

Id-Vg characteristic was investigated with respect to the MOSFET (SON) including double gate structure of the embodiment and the conventional bulk MOSFET (bulk). The result was shown in FIG. 9A and FIG. 9B.

Figure 9A:
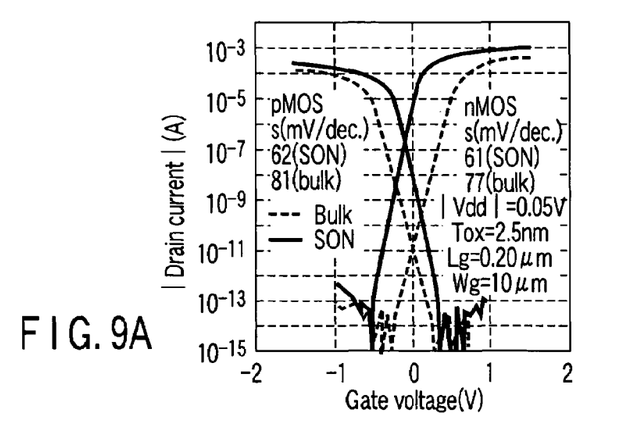
FIG. 9A and FIG. 9B are diagrams showing respective Id-Vg characteristics of the MOSFET including double gate structure of the first embodiment and a conventional bulk MOSFET.
Figure 9B:
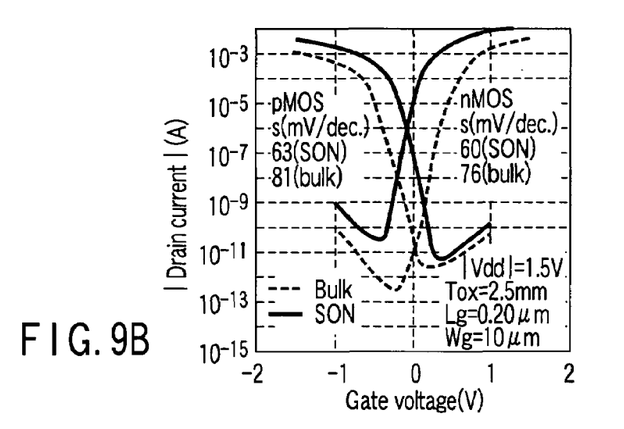

As seen from FIG. 9A and FIG. 9B, it was confirmed that the drain current value of the MOSFET according to the embodiment was about 1.8 times as much as that of the conventional MOSFET. FIG. 9A shows the result when the absolute value of the drain voltage is 0.05V, and FIG. 9B shows the result when the absolute value of the drain voltage is 1.5V. The thickness of the SON was set to 22 nm.

The following matters are given as the reason why the drain current of the MOSFET including double gate structure of the embodiment does not reach two times as much as that of the conventional MOSFET. One of the reasons is that the gate effective length on the back gate side is slightly long. Another is that the gate electrode 9 on the back gate side does not have sufficiently high impurity concentration; for these reasons, the effective gate insulating film thickness becomes thicker by depletion of the gate electrode (polysilicon film) 9.

In the embodiment, the polysilicon film containing impurity is used as the gate electrode; in this case, conductive films including metal may be used. For example, Al film, W film or WSi2 film may be applicable. It is possible to form the foregoing films by metal CVD process.

Figure 10A:
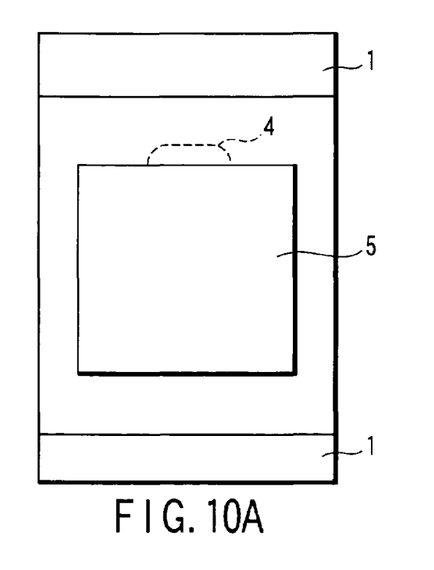
FIG. 10A and FIG. 10B are plane views showing a modification example of the MOSFET including double gate structure of the first embodiment.
Figure 10B:
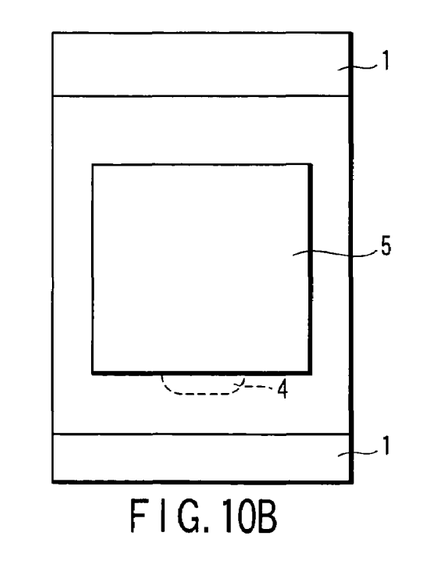

In the embodiment, the mask pattern 5 is formed so that part of the ESS 4, that is, both ends in the channel width direction are not covered, in the process shown in FIG. 3A to FIG. 3C. In this case, the mask pattern 5 may be formed so that only one end is not covered (see FIG. 10A and FIG. 10B).

Figure 11A:
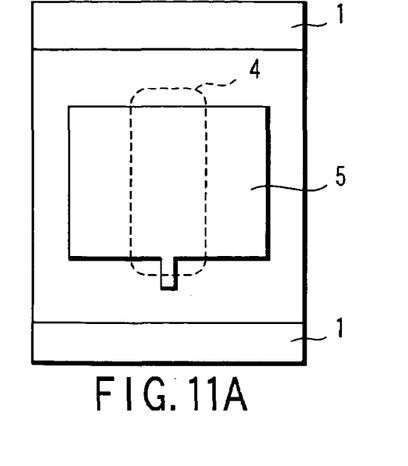
FIG. 11A, FIG. 11B and FIG. 11C are plane views showing another modification example of the MOSFET including double gate structure of the first embodiment.
Figure 11B:
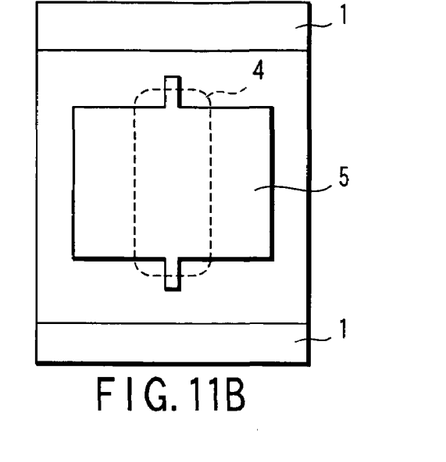
Figure 11C:
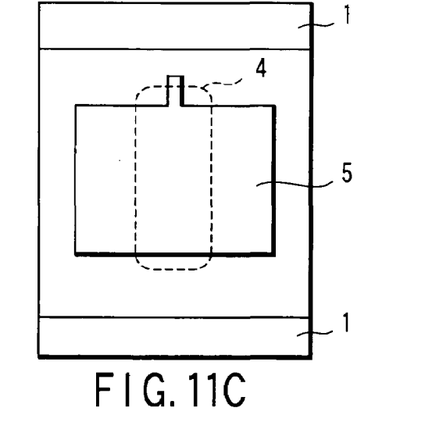

In addition, a mask pattern 5 shown in FIG. 11A to FIG. 11C is formed, and thereby, it is possible to form three or more contact holes 11 in self align.

Second Embodiment

FIG. 12A, FIG. 12B and FIG. 12C to FIG. 19A, FIG. 19A, and FIG. 19C are views showing the process of manufacturing a MOSFET including double gate structure according to a second embodiment of the present invention. FIG. 12B and 12C to FIG. 19B and FIG. 19C are cross-sectional views taken along a line A-A' of FIG. 12A to FIG. 19A and taken along a line B-B' of the same.

Figure 12A:
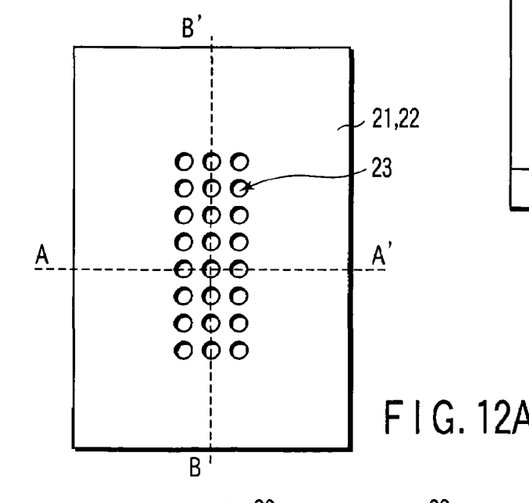
FIG. 12A is a plane view showing the process of manufacturing a MOSFET including double gate structure according to a second embodiment of the present invention.
Figure 12B:
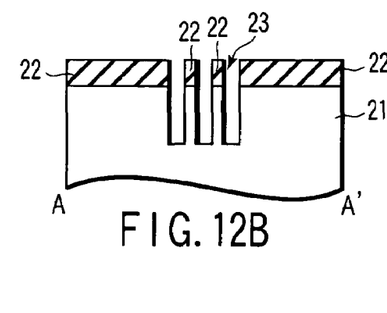
FIG. 12B and FIG. 12C are cross-sectional views showing the same.
Figure 12C:
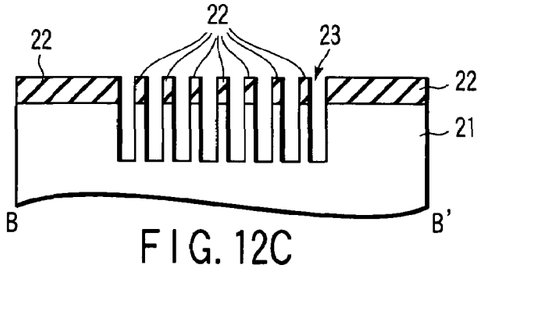

As shown in FIG. 12A to FIG. 12C, a silicon oxide film mask pattern 22 for forming trenches is formed on a silicon substrate 21. The silicon substrate 21 is etched by RIE process using the mask pattern as the mask, and thus, several trenches 23 are formed.

The mask pattern 22 is formed according to the public-known process including the following processes. One is a process of forming a silicon oxide film on the surface of the silicon substrate 21 by thermal oxidation. Another is a process of depositing a silicon oxide film on the surface of the silicon substrate 21 by CVD process. Another is a process of patterning these silicon oxide films (i.e., thermal oxide film, CVD oxide film).

In place of the silicon oxide film mask pattern 22, the following mask pattern may be used. The mask pattern consists of other insulating films such as silicon nitride film or multi-layered insulating film of silicon oxide film/silicon nitride film.

Figure 13A:
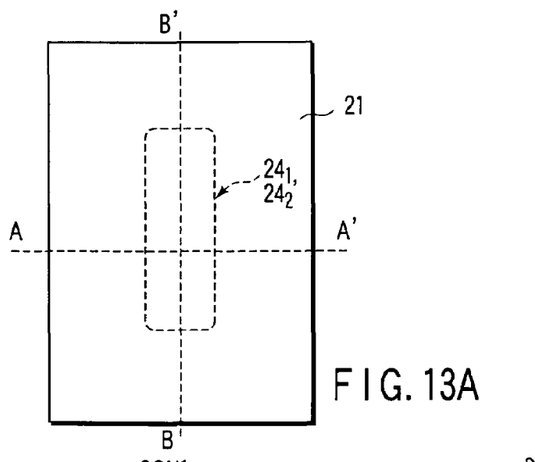
FIG. 13A is a plane view showing the process of manufacturing the MOSFET including double gate structure of the second embodiment and FIG. 13B and FIG. 13C are cross-sectional views showing the same, following FIG. 12A, FIG. 12B and FIG. 12C.
Figures 13B, 13C, 14A, 14B, 14C:
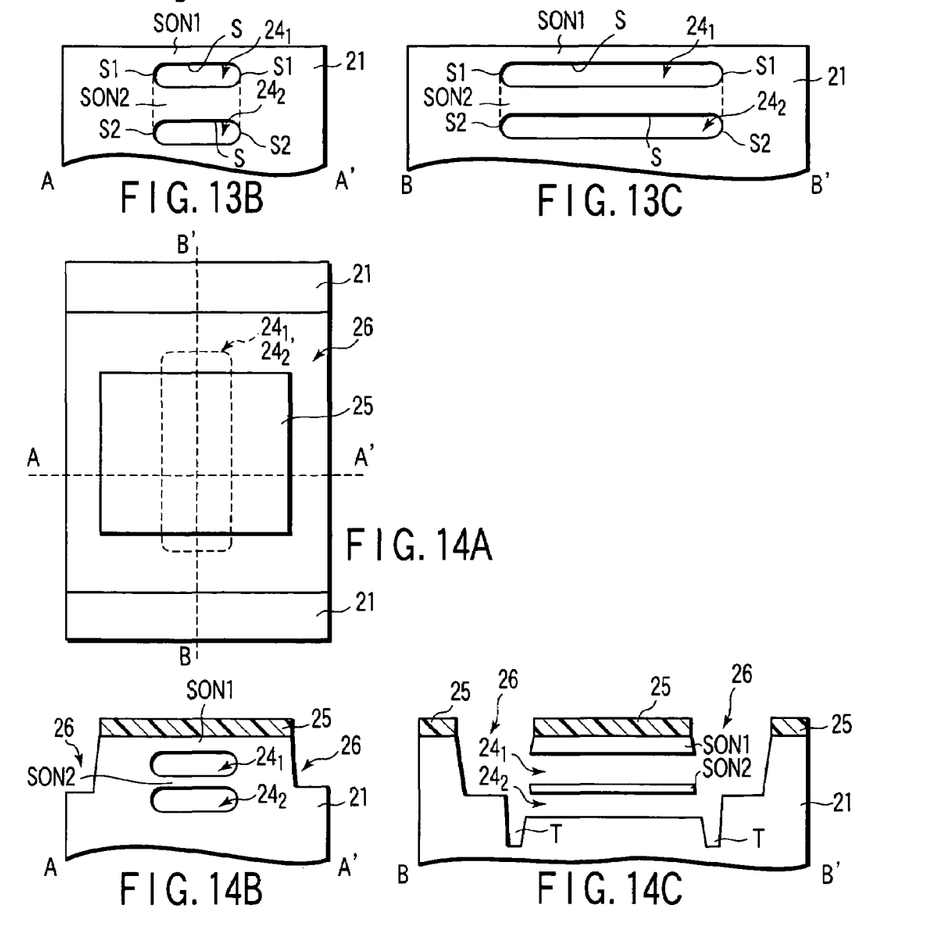
FIG. 14A is a plane view showing the process of manufacturing the MOSFET including double gate structure of the second embodiment.
FIG. 14B and FIG. 14C are cross-sectional views showing the same, following FIG. 13A, FIG. 13B and FIG. 13C.

As illustrated in FIG. 13A to FIG. 13C, the mask pattern 22 is removed by wet etching. Thereafter, the silicon substrate 21 is heated by a heat treatment under low pressure in a reducing atmosphere such as hydrogen, and double layered two empty spaces (ESS) $24_1$ and $24_2$ are formed in the silicon substrate 21.

The ESS $24_1$ and $24_2$ have the same structure. Both sides S1 and S2 of the ESS $24_1$ and $24_2$ are aligned in position in both channel length and width directions.

The front surface (upper surface) and backside (lower surface) of the silicon substrate 21 (SON1) on the ESS $24_1$ and the front surface (upper surface) and backside (lower surface) of the silicon substrate 21 (SON2) on the ESS $24_2$ are regions where the channels of MOSFETs are formed. In the embodiment, part of each side of the SON1 and SON2 is also a region where the channel is formed.

As described above, ESS $24_1$ and $24_2$ have the same structure, and their both sides are aligned in position. Therefore, the channel lengths (gate length) of the gate structure formed on the backside of the SON1, the front surface and backside of the SON2 are the same.

The plane pattern of the ESS $24_1$ and $24_2$ is a longitudinally elongated rectangle (longer side direction is channel width direction, shorter side direction is channel length direction), as seen from FIG. 13A. In this case, other pattern may be used.

The upper surface (top wall) S of the ESS $24_1$, $24_2$ is curved at the corner, as seen from FIG. 13B and FIG. 13C, and other portions thereof are flat. The upper surface S of the ESS $24_1$, $24_2$ is a silicon region formed with the channel; therefore, it is preferable that the upper surface S is flat as much as possible.

The details of the heat treatment for forming the ESS $24_1$, $24_2$ are disclosed in JPN. PAT. APPLN. KOKAI Publication No. 2000-12858. The explanation will be briefly made below. The heat treatment for forming the ESS $24_1$, $24_2$ is carried out in hydrogen or reducing gas atmosphere at the temperature of 1050° C. for 30 seconds.

The reason why the double layer ESS are formed in the present embodiment as different from the first embodiment is that the trench which has a higher aspect than first embodiment. The detail is disclosed in a "International Electron Device Meeting, 20.6 (1999)" or "Japanese Journal of Applied Physics, vol. 43, p. 12, 2004"

A single layer ESS as the ESS in the first embodiment can be formed by setting the depth of the trench 2.5 μm and radius of the trench 0.2 μm.

A double layer ESS as the ESS in the second embodiment can be formed by setting the depth of the trench 5.0 μm and radius of the trench 0.2 μm.

The depth and radius can allowly take various values in accordance with required thickness of the ESS.

If the surface height of the silicon substrate 21 on the ESS $24_1$ reduces due to the heat treatment, a treatment for smoothing the surface of the silicon substrate 21 may be carried out. The smoothing treatment (planarizing) is detailedly disclosed in JPN. PAT. APPLN. KOKAI Publication No. 2001-144276. The explanation will be briefly made below. The treatment for smoothing the surface of the silicon substrate 21 includes the following processes. One is a process of planarizing the surface of the silicon substrate 21 by CPM. Another is a process of oxidizing the planarized the surface of the silicon substrate 21.

As depicted in FIG. 14A to FIG. 14C, a silicon nitride film mask pattern 25 for forming isolation trench is formed on the silicon substrate 21. The mask pattern 25 is formed so that the entire surface of the silicon substrate 21 on the ESS $24_1$, $24_2$, is not covered, but so that part thereof is exposed. Here, as seen from the plane view of FIG. 13A, the mask pattern 5 is formed so that part of the ESS $24_1$, $24_2$ (both ends in channel width direction) is not covered.

Thereafter, the silicon substrate 21 is etched by RIE process using the mask pattern 25 as the mask so that isolation trench (STI) 26 can be formed. After the isolation trench 26 is formed, the ESS $24_1$, $24_2$ is formed into not a closed empty space (cavity) but an opened empty space (cavity). The upper walls on ends of the ESS $24_1$, $24_2$ in the channel width direction are opened due to the isolation trench 26.

In this case, the isolation trench 26 of the embodiment differs from the conventional case in the depth of the bottom partially. More specifically, a region T under the ESS $24_2$, which is not covered with the mask pattern 25, has the bottom deeper than other regions. This results from the following reason. In etching, the portion under the ESS $24_2$, which is not covered with the mask pattern 25, is the same as a state of being previously etched by the depth of the ESS $24_1$, $24_2$.

In this stage, since the MOSFET is not still completed, the isolation trench 26 (isolation region) of the embodiment is explained in view of the relation-ship with the ESS $24_1$, $24_2$. However, after the MOSFET is completed, the isolation region of the embodiment has the structure in which the partial region has deeper bottom than other regions in the isolation trench 26 around the MOSFET.

Figure 15A:
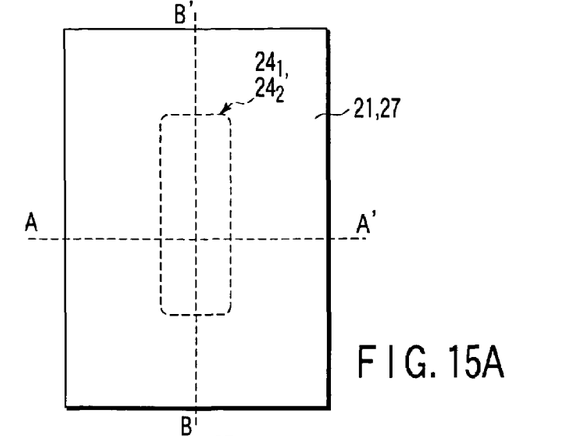
FIG. 15A is a plane view showing the process of manufacturing the MOSFET including double gate structure of the second embodiment.
Figure 15B:
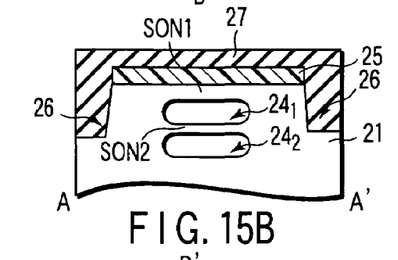
FIG. 15B and FIG. 15C are cross-sectional views showing the same, following FIG. 14A, FIG. 14B and FIG. 14C.
Figure 15C:
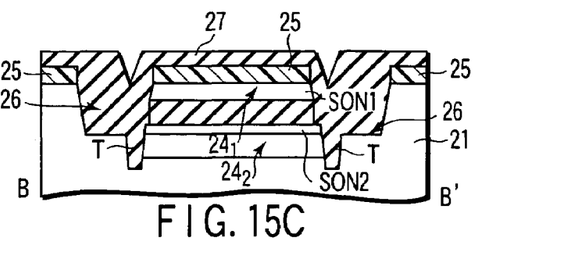

As seen from FIG. 15A to FIG. 15C, a silicon oxide film 27 (insulator) is deposited on the entire surface as the buried member of the isolation trench 26 by anisotropic deposition process such as HDP-CVD process.

Figure 16A:
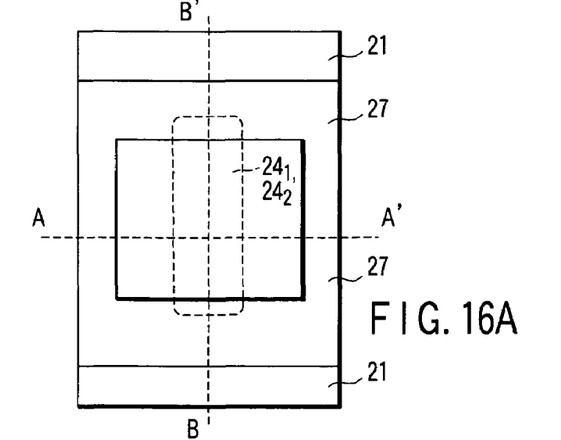
FIG. 16A is a plane view showing the process of manufacturing the MOSFET including double gate structure of the second embodiment.
Figure 16B:
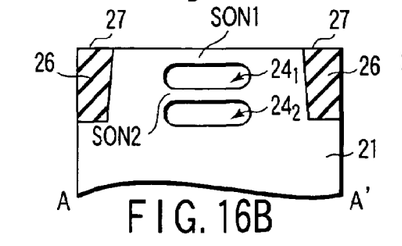
FIG. 16B and FIG. 16C are cross-sectional views showing the same, following FIG. 15A, FIG. 15B and FIG. 15C;.
Figure 16C:
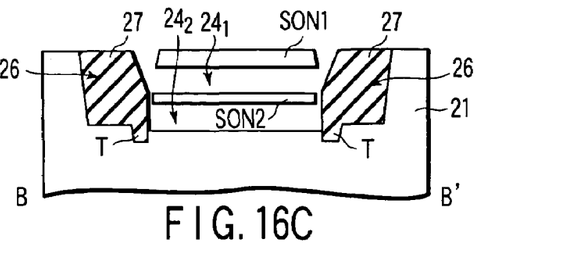

As illustrated in FIG. 16A to FIG. 16C, the silicon oxide film 27 other than the isolation trench 26 is removed by CMP process. Then, the mask pattern 25 is removed while the surface of the silicon substrate 21 is planarized. In this case, the mask pattern 25 may be removed by etching.

In this way, the isolation region for isolating the MOSFET formed in the next process from other elements (e.g., other MOSFET including double gate structure) is completed.

In this case, as seen from FIG. 16A to FIG. 16C, the region in which the silicon oxide film 27 is not buried remains at both sides of the ESS $24_1$, $24_2$. This is because the silicon oxide film 27 is deposited by anisotropic deposition process. If the region (gap) in which the silicon oxide film 7 is not buried remains at both sides of the ESS $24_1$, $24_2$, the silicon oxide film 27 may be formed by isotropic deposition process.

Figure 17A:
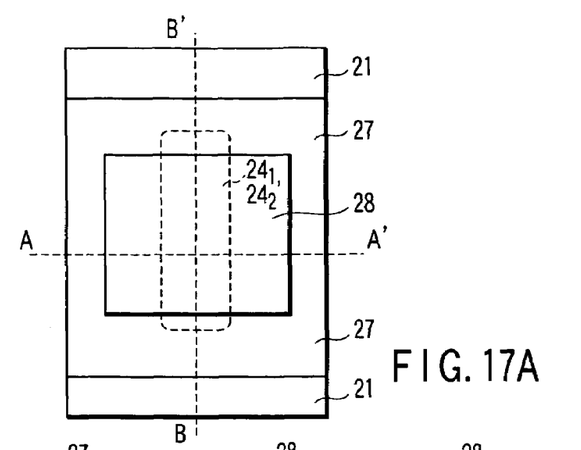
FIG. 17A is a plane view showing the process of manufacturing the MOSFET including double gate structure of the second embodiment.
Figure 17B:
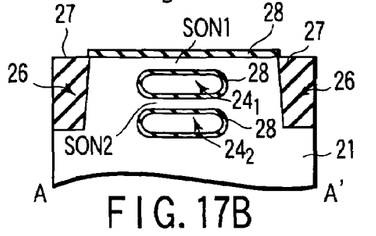
FIG. 17B and FIG. 17C are cross-sectional views showing the same, following FIG. 16A, FIG. 16B and FIG. 16C.
Figure 17C:
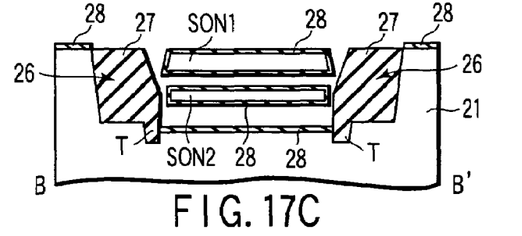

As depicted in FIG. 17, a gate insulating film (thermal oxide film) 28 is formed on the surface of the silicon substrate 21 by public-known thermal oxidation.

The gate insulating film 28 is formed on the entire surface of exposed silicon shown in FIG. 17. Thus, the gate insulating film 8 is formed on any of the upper, side and lower surfaces of the SON1 and SON2 and the lower surface (bottom) of the ESS $24_2$. In other words, the lower surfaces of the SON1 and SON2 are the upper surfaces (top wall) of ESS $24_1$ and $24_2$.

According to the embodiment, the gate insulating films, that is, top and bottom gate insulating films on the silicon substrate 21 and therein are simultaneously formed by the identical process. Therefore, the process is simplified.

In the embodiment, the thermal oxide film is used as the gate insulating film 28. In this case, a silicon oxide film formed by the method using radical or silicon oxinitride film (SiON film) may be used. In addition, the following process may be employed. According to the process, the thermal oxide film is simultaneously formed on the upper and lower surfaces of the SON1 and SON2 of the MOSFET, thereafter, nitriding is carried out with respect to only upper surface of the SON1. Namely, the thermal oxide film is formed on the lower surface of the SON1, the upper and lower surfaces of the SON2 while the SiON film is formed on the upper surface of the SON1.

Incidentally, it is necessary to form the bottom gate insulating film in view of the following matter. The bottom gate insulating film is positioned on the upper and lower surface of the ESS $24_1$, the upper and lower surfaces of the ESS $24_2$. In addition, the bottom gate insulating film has no need to entirely close the inner wall of the ESS $24_1$, $24_2$. In other words, it is sufficient the bottom gate insulating film is formed at least on the lower surface of the SON1, the upper and lower surfaces of the SON2.

Figure 18A:
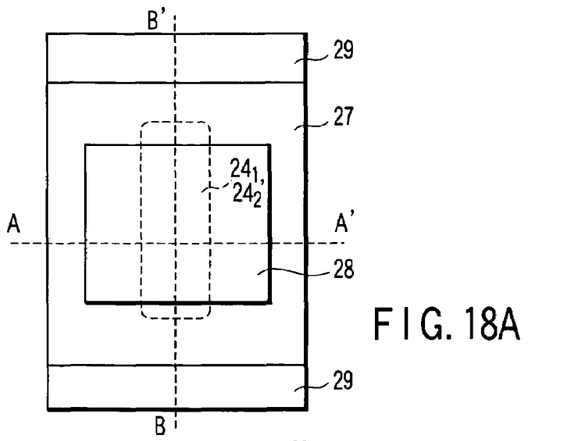
FIG. 18A is a plane view showing the process of manufacturing the MOSFET including double gate structure of the second embodiment.
Figure 18B:
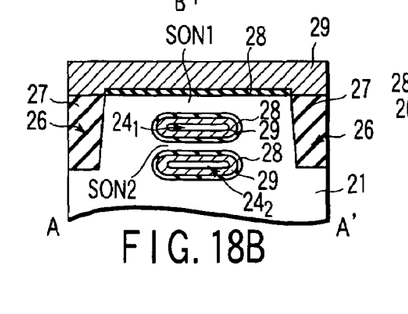
FIG. 18B and FIG. 18C are cross-sectional views showing the same, following FIG. 17A, FIG. 17B and FIG. 17C.
Figure 18C:
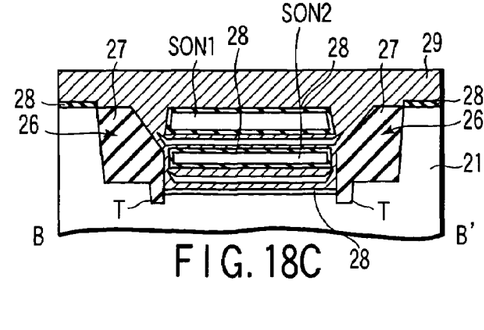

As shown in FIG. 18A to FIG. 18C, a polysilicon film 29 functioning as the gate electrode is deposited on the gate insulating film 28 by CVD process. The polysilicon film 29 contains impurity.

In the deposition of the polysilicon film 29, Si source gas is introduced into the ESS $24_1$, $24_2$ from openings at both sides of the ESS $24_1$, $24_2$, that is, the region (gap) in which the silicon oxide film 27 is not buried. In this way, the polysilicon film 29 is deposited on the inner wall (gate insulating film 28) of the ESS $24_1$, $24_2$. The deposition of the polysilicon film 29 on the inner wall of the ESS $24_1$, $24_2$ is carried out until the gap is filled with the polysilicon film 29.

According to the embodiment, the polysilicon films 29 functioning as top and bottom gate electrodes are simultaneously formed by the identical process. Therefore, the process is simplified.

The ESS $24_1$, $24_2$ is not entirely filled with the polysilicon film 29 on normal polysilicon CVD process condition. Therefore, part of the ESS $24_1$, $24_2$ finally remains without being filled with the polysilicon film. For example, non-filled portions of the ESS $24_1$, $24_2$ (i.e., space, which is not filled with bottom gate electrode and insulating film) contribute to reduction of leakage current. The ESS $24_1$, $24_2$ can be entirely buried depending upon the process condition of the polysilicon film 29 deposition.

Figures 19A, 19B, 19C:
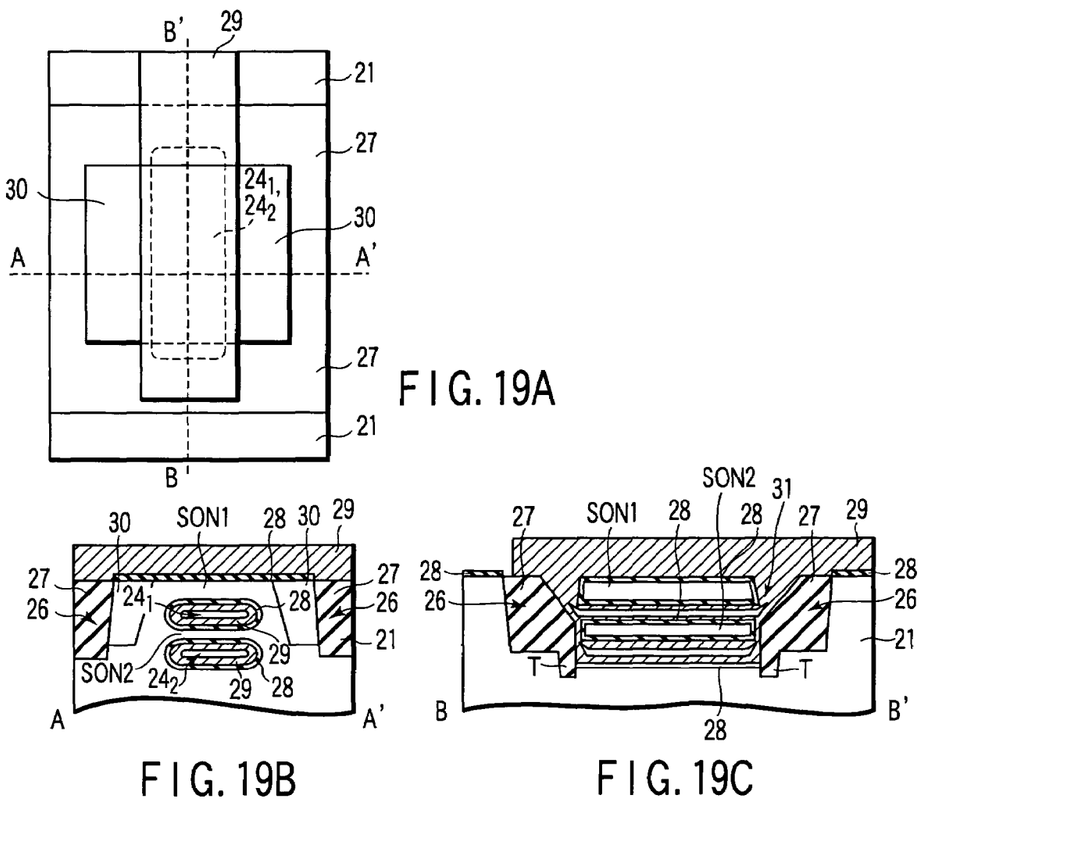
FIG. 19A is a plane view showing the process of manufacturing the MOSFET including double gate structure of the second embodiment.
FIG. 19B and FIG. 19C are cross-sectional views showing the same, following FIG. 18A, FIG. 18B and FIG. 18C.

Incidentally, impurity doping into the polysilicon film 29 may be carried out according to normal methods. For example, if ion implantation is employed, dopant ion is not implanted to the back gate side. However, the diffusion coefficient of dopant impurity into the polysilicon film is high, that is, 100 times as much as that of single crystal silicon. Thus, heat treatment is carried out after ion implantation, and thereby, it is possible to form a low-resistance polysilicon film 29 whose back gate side is doped with dopant impurity with high concentration. In addition, the method of in-situ impurity doping in deposition of the polysilicon film 29 may be employed As illustrated in FIG. 19A to FIG. 19C, the polysilicon film 29 is etched using resist pattern (not shown) as the mask, and thus, a gate electrode is formed. In this case, etching is carried out so that each polysilicon film 29 on the silicon substrate 21 and in the ESS $24_1$, $24_2$ is not divided.

According to the embodiment, the process of patterning each polysilicon film 29 for forming top and bottom gate electrodes is the same; therefore, the process is simplified.

Thereafter, as seen from FIG. 19A to FIG. 19C, the MOSFET including double gate structure is completed via the following public-known MOSFET process, such as process of forming a source/drain region 30 by ion implantation and annealing. In this case, the depth of the source/drain region 30 is deeper than the upper surface of the SON2.

According to the embodiment, the following double gate structures are simultaneously formed by common process. That is the gate structure (top gate structure) on the silicon substrate 21 and the gate structure (bottom gate structure) in the silicon substrate 21. Therefore, a MOS transistor including double gate structure can be realized by very simple process as compared with the conventional method of separately forming top and bottom gate structures by individual processes.

In the MOS transistor having two empty spaces described in the embodiment, first to fourth channels are formed on the upper, lower surfaces of the SON1, the upper and lower surfaces of the SON2, respectively. On the other hand, in the MOS transistor having one empty space (first embodiment), the first and second channels are formed on the upper and lower surfaces of the SON, respectively. Therefore, in the MOS transistor of the present embodiment, the drain current flows approximately two times as much as the MOS transistor having one empty space.

As described before, the channel lengths (gate length) of gate structure formed on the backside of the SON1, front surface and backside of the SON2 are the same. In other words, second to fourth channels are vertically formed by the gate structure in the substrate excluding the gate structure on the substrate surface of the normal MOS transistor. Thus, these second to fourth channels have symmetry with respect to channel length and width directions. This contributes to improving device performance.

In addition, according to the embodiment, the polysilicon film 29 is deposited in the isolation trench 26 around MOSFET, that is, the region having the deeper bottom in deposition of the polysilicon film 29 shown in FIG. 18. Thus, the isolation trench 6 under the polysilicon film 29 is provided with part of the silicon oxide film 27.

As a result, the polysilicon film 29 (side gate electrode) is formed on the gate insulating film 28 on the side surfaces of SON1 and SON2. Consequently, the side surface (sidewall) of the SON1 and SON2 is formed with a channel.

Therefore, a MOS transistor including the following structure is formed. More specifically, the MOS transistor has the structure in which the silicon region (silicon substrate 21) around the SON1 and SON2 is covered with gate insulating film and gate electrode by the process for originally forming double gate structure. Namely, the MOS transistor has double layer gate all around structure (gate structure including double gate structure).

According to the embodiment, the side surface is formed with the channel, in addition to upper and lower surfaces of the MOSFET active region (SON1 and SON2); therefore, current drive capability can be improved.

According to the embodiment, gate electrodes 29 (top and bottom gate electrodes) on upper and lower surfaces of the SON1 and SON2 are connected via two contact holes 21 on both sides of the MOSFET including double gate structure, as depicted in FIG. 19A, to FIG. 19C. Therefore, gate parasitic resistance can be reduced.

According to the embodiment, the contact hole 31 connecting top and bottom gate electrodes is formed by means of self align. Therefore, it is unnecessary to secure a region for misalignment. In other words, there is no problem of increasing the chip area even if the double gate structure of the embodiment is employed.

The top and bottom gate electrodes may be are formed physically independent of each other although they are integrally formed. In this case, there is a need of forming the structure for simultaneously applying the same voltage to these top and bottom gate electrodes.

Consequently, it is basically preferable that the top and bottom gate electrodes are integrally formed. The integrally formed gate electrode 29 can be readily formed according to the present embodiment, as described above.

Id-Vg characteristic was investigated with respect to the MOSFET (SON) including double gate structure of the embodiment and the conventional bulk MOSFET. As a result, it was confirmed that the drain current value of the MOSFET according to the embodiment was about 3.8 times as much as that of the conventional MOSFET.

The following matters are given as the reason why the drain current of the MOSFET including double gate structure of the embodiment does not reach four times as much as that of the conventional MOSFET. One of the reasons is that the gate effective length on the back gate side is slightly long. Another is that the gate electrode 29 on the back gate side does not have sufficiently high impurity concentration; for these reasons, the effective gate insulating film thickness becomes thicker by depletion of the gate electrode (polysilicon film) 29.

In the second embodiment, the same modification as the first embodiment is possible. The second embodiment has described the MOSFET including double gate structure using two (two-layered) empty spaces. Likewise, it is possible to carry out a MOSFET including double gate structure or all around structure using three (three-layered) empty spaces or more.

In the first and second embodiments, no reference is made with respect to the channel type in particular. The present invention is applicable to any of n-channel and p-channel double gate MOSFETs. Basically, the type of the dopant used in source/drain region may be inverted between n-channel and p-channel.

In addition, n-channel and p-channel double gate MOSFETs may be formed on the identical substrate. CMOS may be formed using the n-channel and p-channel double gate MOSFETs.

The double gate MOSFET to which the present invention is applied may be used as the switching element of memory such as DRAM.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate including a main surface;
   a MOSFET including a double gate structure provided on a side of the main surface of the semiconductor substrate, the double gate structure comprising top and bottom gate electrodes, the bottom gate electrode being located at a lower level than the main surface;
   an isolation region for isolating the MOSFET from other elements comprising a trench provided on the side of the main surface of the semiconductor substrate and an insulator provided in the trench, the isolation region having a region in the trench around the MOSFET, the region having a deeper bottom than other regions in the trench, and all of the region having the deeper bottom being covered with the top gate electrode; and
   a side gate electrode and a side gate insulating film provided in the region having the deeper bottom than the other regions in the trench around the MOSFET, wherein a part of the insulator is provided in the region having the deeper bottom than the other regions under the side gate electrode.

2. The semiconductor device according to claim 1, wherein the bottom gate electrode is provided in the semiconductor substrate, a part of the side of the main surface of the semiconductor substrate is placed between the top gate electrode and bottom gate electrode, and the MOSFET further comprises:
   a top gate insulating film provided between the top gate electrode and the semiconductor substrate; and
   a bottom gate insulating film provided between the semiconductor substrate below the top gate electrode and the bottom gate electrode.

3. The semiconductor device according to claim 1, wherein the whole of the region having the deeper bottom is located under the top gate electrode.

4. A semiconductor device comprising:
   a semiconductor substrate;
   a MOSFET including a double gate structure comprising top and bottom gate electrodes and provided on the semiconductor substrate; and
   an isolation region for isolating the MOSFET from other elements comprising a trench provided on a surface of the semiconductor substrate and an insulator provided in the trench, the isolation region having a region in the trench around the MOSFET, the region having a deeper bottom than other regions in the trench, and all of the region having the deeper bottom being covered with the bottom gate electrode,
   wherein the semiconductor substrate is provided with at least one empty space, and the bottom gate electrode and a bottom gate insulating film are provided in the at least one empty space, and
   the trench opens a part of an upper wall of the at least one empty space, and a side gate insulating film and a side gate electrode are successively provided on a side of the semiconductor substrate on the at least one empty space opened by the trench.

5. The semiconductor device according to claim 4, further comprising a top gate insulating film formed between the top gate electrode and the semiconductor substrate, wherein the bottom gate insulating film, the side gate insulating film, and the top gate insulating film are unified.

6. The semiconductor device according to claim 5, wherein the bottom gate insulating film, the side gate insulating film, and the top gate insulating film are formed of a common thermal oxide film.

7. The semiconductor device according to claim 4, wherein the bottom gate electrode, the side gate electrode, and the top gate electrode are unified.

8. The semiconductor device according to claim 5, wherein the bottom gate electrode, the side gate electrode, and the top gate electrode are unified.

9. The semiconductor device according to claim 6, wherein the bottom gate electrode, the side gate electrode, and the top gate electrode are unified.

10. The semiconductor device according to claim 7, wherein the bottom gate electrode, the side gate electrode, and the top gate electrode are formed of a common conductive film.

11. The semiconductor device according to claim 10, wherein the common conductive film is a semiconductor film containing an impurity or film containing metal.

12. The semiconductor device according to claim 4, wherein a part of the at least one empty space remains unfilled by the bottom gate electrode and the bottom gate insulation film.

13. The semiconductor device according to claim 4, wherein the at least one empty space comprises an upper wall including a flat region.

14. The semiconductor device according to claim 4, wherein the at least one empty space is arranged in a thickness direction of the semiconductor substrate, and the bottom gate insulating film and the bottom gate electrode are provided in the at least one empty space.

* * * * *